(12) United States Patent
Duval

(10) Patent No.: US 10,861,792 B2
(45) Date of Patent: Dec. 8, 2020

(54) PATTERNED WAFER SOLDER DIFFUSION BARRIER

(71) Applicant: Raytheon Company, Waltham, MA (US)

(72) Inventor: Paul J. Duval, Lexington, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/363,072

(22) Filed: Mar. 25, 2019

(65) Prior Publication Data

US 2020/0312776 A1 Oct. 1, 2020

(51) Int. Cl.
*H01L 23/532* (2006.01)
*H01L 21/768* (2006.01)
*H01L 23/522* (2006.01)

(52) U.S. Cl.
CPC .. *H01L 23/53252* (2013.01); *H01L 21/76847* (2013.01); *H01L 23/5226* (2013.01); *H01L 23/53247* (2013.01)

(58) Field of Classification Search
CPC .............. H01L 23/5226; H01L 21/76847
See application file for complete search history.

(56) References Cited

U.S. PATENT DOCUMENTS

| | | | |
|---|---|---|---|
| 5,027,189 A * | 6/1991 | Shannon | H01L 23/481 257/783 |
| 5,646,426 A | 7/1997 | Cockrum et al. | |
| 5,668,054 A | 9/1997 | Sun et al. | |
| 5,844,321 A | 12/1998 | Baudet | |
| 6,596,635 B1 | 7/2003 | Tiku et al. | |
| 9,355,937 B2 | 5/2016 | Koyama | |
| 2002/0070423 A1* | 6/2002 | Takafuji | H01L 21/4853 257/532 |
| 2012/0153492 A1* | 6/2012 | Bachman | H01L 21/76898 257/774 |
| 2013/0193575 A1* | 8/2013 | Shen | H01L 24/03 257/751 |
| 2014/0264868 A1* | 9/2014 | Radulescu | H01L 21/32139 257/751 |

(Continued)

FOREIGN PATENT DOCUMENTS

| | | |
|---|---|---|
| EP | 0 436 912 A1 | 7/1991 |
| EP | 0 631 313 A1 | 12/1994 |

OTHER PUBLICATIONS

Davydov et al., "Combinatorial Investigation of Structural Quality of Au/Ni Contacts on GaN;" Applied Surface Science, vol. 223, Issues 1-3; Feb. 15, 2004; pp. 24-29; 6 Pages.

(Continued)

*Primary Examiner* — Jay C Chang
*Assistant Examiner* — Mikka Liu
(74) *Attorney, Agent, or Firm* — Daly Crowley Mofford & Durkee, LLP

(57) ABSTRACT

Methods and apparatus for an integrated circuit having with a frontside metal layer on the frontside of the substrate and a backside metal layer on the backside of the substrate. The backside metal layer is deposited onto the backside of the substrate and into the via such that a portion of the backside metal layer is connected to a portion of the frontside metal layer. A diffusion barrier layer is deposited on the backside metal layer located in the via.

19 Claims, 5 Drawing Sheets

(56) References Cited

U.S. PATENT DOCUMENTS

2016/0351516 A1* 12/2016 Karlovsky .............. H01L 24/05

OTHER PUBLICATIONS

Dong, "Design of the Contact Metallizations for Gold-Tin Eutectic Solder-A Thermodynamic-Kinetic Analysis;" Doctoral Dissertations 176/2016—Department of Electrical Engineering and Automation at Aalto University; Sep. 30, 2016; 59 Pages.

He et al., "Characterization of a Mo Diffusion Barrier for Au/Sn Solder Bonding of Micro/Optoelectronic Devices to Carriers;" Microscopy and Microanalysis, vol. 8 (Suppl. 2); Jan. 2002; 2 Pages.

Josell et al., "Superconformal Bottom-Up Nickel Deposition in High Aspect Ratio Through Silicon Vias;" Journal of the Electrochemical Society, vol. 163, No. 7; pp. D322-D331; Jan. 2016; 10 Pages.

PCT International Search Report and Written Opinion dated May 25, 2020 for International Application No. PCT/US2020/020074; 13 Pages.

\* cited by examiner

PATTERNED WAFER SOLDER DIFFUSION BARRIER

BACKGROUND

Some types of integrated circuits (ICs), for example, Monolithic Microwave Integrated Circuit (MMIC) chips fabricated using Gallium Arsenide (GaAs) or Gallium Nitride (GaN), may be coated on the backside with an Au (gold) layer. The Au layer extends up through one or more vias etched into a substrate or wafer of the IC to allow the ground contact to be made on the backside of the wafer. The ground attachment to the chip is conventionally made with a Gold-Tin (Au—Sn) eutectic solder. While the Au—Sn solder may be effective for GaAs chips, the higher power achieved with GaN chips has resulted in the chips running at higher temperatures which may accelerate Au—Sn solder diffusion through the vias and onto the front of the wafer. The diffusion may cause distortion in the airbridge patterns at the frontside of the wafer and also may cause forming voids in the thin backside Au layer of the wafer.

Various solutions have been proposed and used to reduce interactions between the solder material and the metal layers that are being bonded/connected. The solutions typically include barriers applied in layers to prevent diffusion from one layer into another. For example, coating contact areas for inhibiting diffusion or layering diffusion-inhibiting layers into the metal contacts have been proposed as diffusion barriers. However, application of the diffusion barrier layer on the front of the wafer may be ineffective because etching vias using Silicon Carbide (SiC) or GaN may continue to etch through the first two or three metal layers on the wafer frontside. In addition, the uneven topology of the via structure in SiC/GaN devices poses a challenge to cover with an evaporated or sputtered barrier layer. Furthermore, if a barrier layer is applied under a plated gold layer, the barrier layer may increase the series resistance between the frontside metal layer and the backside ground connection (i.e., backside metal layer).

SUMMARY

In accordance with the concepts, techniques described herein is an efficient method for forming a diffusion barrier. The techniques described herein may provide a patterning solution working on an integrated circuit having a thin metal layer that may be damaged by prolonged contact at an elevated temperature to solder material.

According to one illustrative embodiment, a method for fabricating an integrated circuit may include: providing a substrate having a frontside and a backside; depositing a frontside metal layer on the frontside of the substrate; forming a via in the substrate; depositing a backside metal layer onto the backside of the substrate and into the via such that a portion of the backside metal layer is connected to a portion of the frontside metal layer; and depositing a diffusion barrier layer onto the backside metal layer located in the via, the diffusion barrier substantially maintaining a shape of the via.

In one aspect, the diffusion barrier may comprise a nickel (Ni) layer. In another aspect, the diffusion barrier may comprise at least one of tantalum nitride, tungsten nitride, titanium nitride, and chromium.

In one aspect, the diffusion barrier may be oxidized to form a solder wetting barrier.

In one aspect, the method may further comprise depositing a solder layer upon the diffusion barrier filling only a portion of the via.

In one aspect, the method may further comprise depositing a thin layer of adhesive material between the frontside metal layer and the backside metal layer.

In one aspect, the depositing the diffusion barrier may comprise patterning the diffusion barrier over the backside metal layer.

In one aspect, the backside metal layer may comprise breaks proximate an end of the via corresponding to the backside of the substrate, and further including depositing the diffusion barrier into the breaks.

In one aspect, the frontside metal layer may comprise gold.

In one aspect, the backside metal layer may comprise gold.

According to another illustrative embodiment, an integrated circuit may include: a substrate having a frontside and a backside; a frontside metal layer deposited on the frontside of the substrate; a backside metal layer deposited onto the backside of the substrate and into a via formed in the substrate, wherein a portion of the backside metal layer is connected to a portion of the frontside metal layer; and a diffusion barrier deposited onto the backside metal layer located in the via, wherein the diffusion barrier substantially maintains a shape of the via.

In one aspect, the integrated circuit may further include a thin layer of adhesive material deposited between the frontside metal layer and the backside metal layer.

The details of one or more embodiments of the disclosure are outlined in the accompanying drawings and the description below. Other features, objects, and advantages of the disclosure will be apparent from the description and drawings, and from the claims.

BRIEF DESCRIPTION OF THE DRAWINGS

The foregoing features may be more fully understood from the following description of the drawings in which.

DETAILED DESCRIPTION

Relative descriptions used herein, such as left, right, up, and down, are with reference to the figures, are merely relative and not meant in a limiting sense. Additionally, for clarity, common items and circuitry, such as integrated circuits, resistors, capacitors, transistors, and the like, have not been included in the figures, as can be appreciated by those of ordinary skill in the pertinent art. Unless otherwise specified, the illustrated embodiments may be understood as providing illustrative features of varying detail of certain embodiments, and therefore, unless otherwise specified, features, components, modules, elements, and/or aspects of the illustrations can be otherwise combined, interconnected, sequenced, separated, interchanged, positioned, and/or rearranged without materially departing from the disclosed concepts, systems, or methods. Additionally, the shapes and sizes of components are intended to be only illustrative and unless otherwise specified, can be altered without materially affecting or limiting the scope of the concepts sought to be protected herein.

Figure 1:
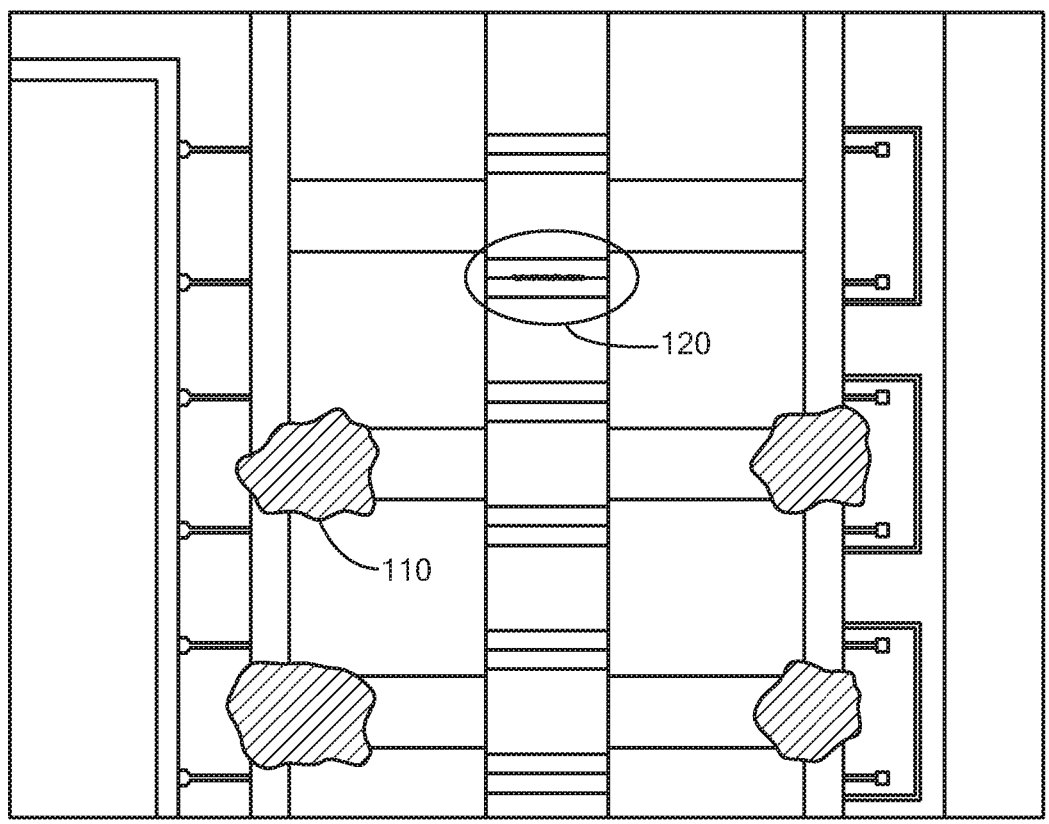
FIG. 1 is an exemplary figure showing damages from solder diffusion in a prior art integrated circuit.

Referring now to FIG. 1, an exemplary figure showing damages from solder diffusion in a prior art integrated circuit is provided. For an integrated circuit (IC) that is coated on the backside with an Au (gold) layer, the ground attachment to the chip is conventionally made with a Gold-Tin (Au—Sn) eutectic solder. For some type of chips having higher power, the chips may run at higher temperatures which may result in an acceleration of Au—Sn diffusion. The diffusion may happen for both directions. First, Tin (Sn) in the solder material (Au—Sn) may diffuse (in-diffusion) to the gold layer. The gold (Au) in the gold layer may also diffuse (out-diffusion) towards the solder layer. The solder diffusion may cause distortion (e.g., metal protruding out of the frontside) 110 in the airbridge patterns at the frontside of the wafer. The distortion 110 may be visible from the frontside of the wafer. The diffusion may also form voids 120 in the thin frontside Au layer of the wafer.

Figure 2:
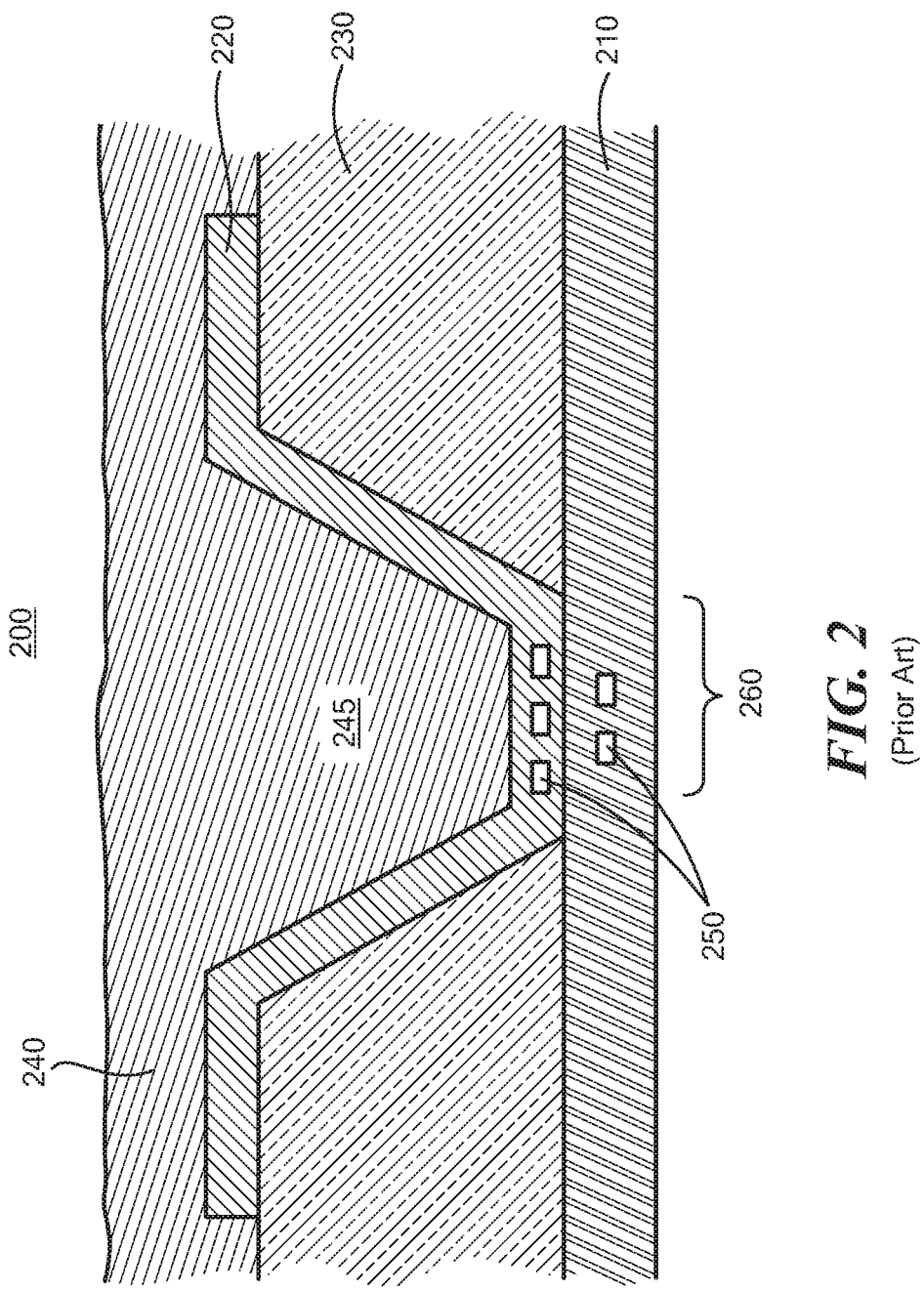
FIG. 2 is a cross-sectional view showing damage from solder diffusion in a prior art integrated circuit.

Referring now to FIG. 2, diffusion from solder may occur when solder material fills a via formed in a substrate. An integrated circuit (IC) package 200 includes a substrate 230, a frontside gold layer 210, and a backside gold layer 220. When solder material (e.g., Au—Sn) 240 is applied to the backside gold layer 220, excessive wetting of the solder may cause the solder material 240 to fill the via 245 formed in the substrate 230 where the sides of the via are covered by the backside gold layer 220. In addition, the solder material 240 may diffuse into the backside gold layer 220. In this case, the diffusion of the solder material 240 and the frontside gold layer 210 may cause damage to the IC 200 by creating a distortion 260 onto the frontside gold layer 210. Additionally, the diffusion may cause voids 250 formed inside of the frontside gold layer 210 and/or the backside gold layer 220. Additionally, the difference in thermal expansion between the solder material 240 and the substrate 230 may result in physical damage to the substrate 230 such as cracking when the integrated circuit package 200 is operated at an elevated temperature. The physical damage to the substrate 230 may be further increased when the solder material 240 fills the via 245.

Figure 3B:
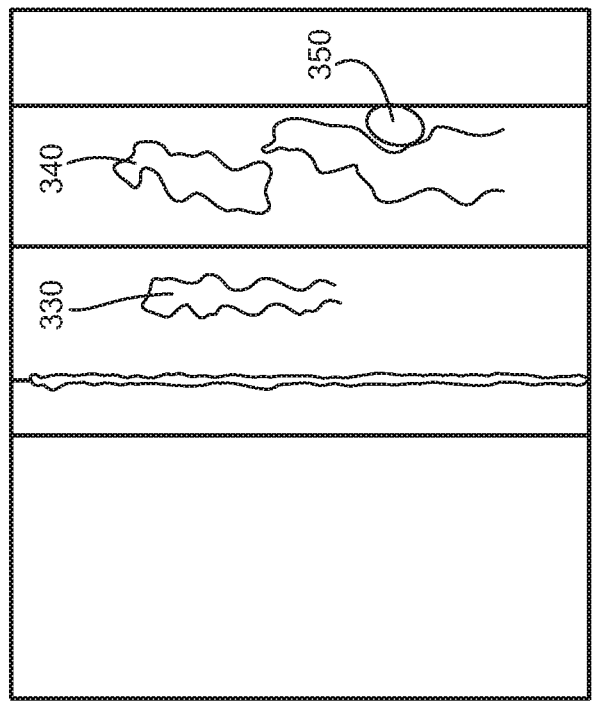
FIGS. 3A-3B are exemplary figures showing voids formed in metal layers from solder diffusion in a prior art integrated circuit.
Figure 3A:
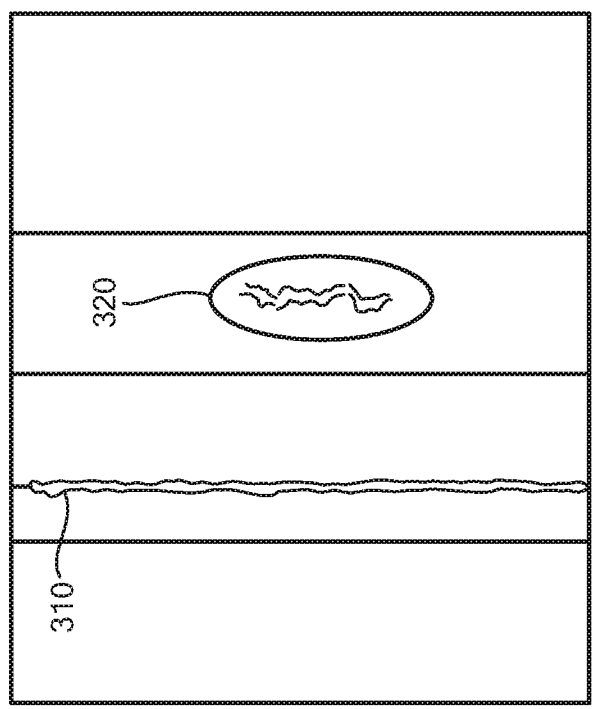

Referring now to FIGS. 3A-3B, the figures showing voids formed from solder diffusion in a conventional IC package are presented. FIG. 3A shows an example of minor voids formed in frontside and backside gold layers from solder diffusion. When solder material (e.g., 240 in FIG. 2) fills a via and diffuse through the backside gold layer, Kirkendall void formation can occur in metal structures on the frontside of the wafer such as the source connected field plate 310 and 320. For example, the solder material may affect a source connected field plate in the gate area 310. The area 320 shows that small size voids are made in the area adjacent to where the source-connected field plate (SCFP) metal contacts the ohmic contact metal. FIG. 3B shows an example of severe damages caused by solder diffusion. Areas 330, 340 show that voids are formed in the gold layer severe enough such that the gold layer is no longer functioning as a contact, which creates an isolated (i.e., disconnected) area at 350.

Figure 4:
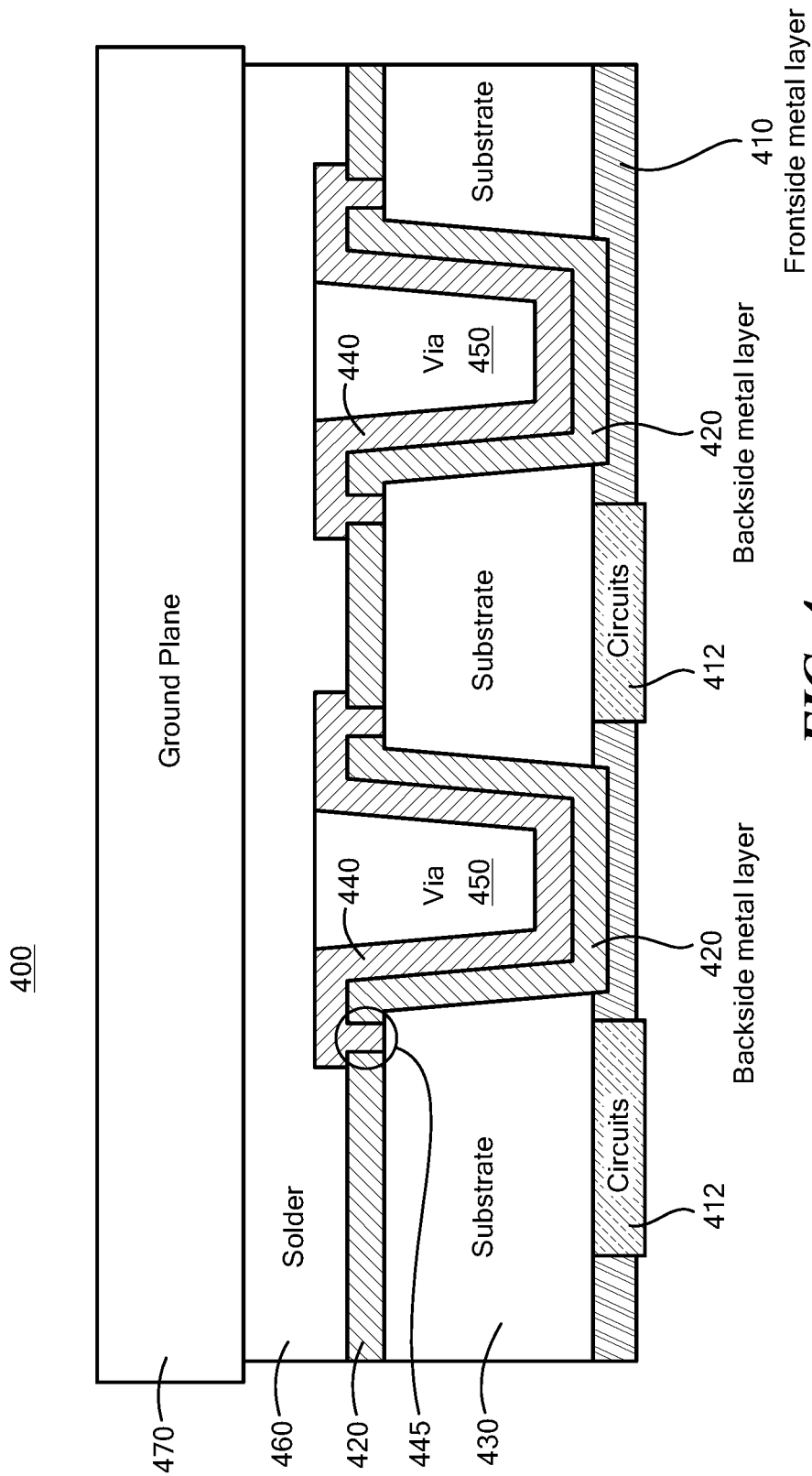
FIG. 4 is a cross-sectional view showing an integrated circuit having a diffusion barrier according to the concepts described herein.

Referring now to FIG. 4, an integrated circuit (IC) package 400 having a diffusion barrier in accordance with example embodiments of the invention is presented. The IC 400 comprises a substrate or wafer 430, a frontside metal layer 410, a backside metal layer 420, and a diffusion barrier 440. In embodiments, the substrate 430 may comprise silicon carbide. The frontside metal layer 410 may be deposited on the substrate 430 as metal interconnects to connect active and passive components 412. Gold (Au) may be used to form the frontside metal layer, but other suitable materials may be used. In embodiments, the frontside metal layer 410 in combination with other metals of the IC package may provide Schottky contacts or Ohmic contacts.

The connected active/passive components may form circuit areas 412 on the substrate 430. When the fabrication of the frontside layer 410 is completed, the substrate 430 is further processed at the backside where one or more vias 450 are formed through the substrate to enable contact with frontside metal layer 410 for connection to ground, for example. In embodiments, the vias 450 may be formed by an etching process. In the one or more vias 450, the backside metal layer 420 created by depositing a metal film on the backside of the substrate 430 and on the surface of the substrate in the vias 450. At one end of the vias 450, the backside metal layer 420 makes contact with the frontside metal layer 410. The frontside and backside metal layers 410, 420 may comprise gold, but any suitable material may be used. In some embodiments, the frontside metal layer may comprise Titanium (Ti), Gold (Au), Platinum (Pt), or Aluminum (Al). Alternately, Copper (Cu) or refractory metal such as Tantalum (Ta) and Tungsten (W) may be used in the frontside metal layer.

The backside metal layer 420 may substantially maintain the shape of the via 450. In embodiments, the via 450 may have a tapered shape such that the bottom of the via 450 is smaller than the top of the via 450. In some embodiments, a thin layer of other materials, for example, Titanium (Ti) or Titanium-Tungsten (TiW), can provide improved adhesion between the frontside layer 410 and the backside layer 420, and the substrate 430. In other embodiments, one or more layers of other materials to reduce electromigration between the layers 410, 420 may be provided.

One or more breaks or solder-stops 445 may be formed in the backside metal layer 420. The breaks 445 prevent a direct diffusion path in the backside metal layer 420. In embodiments, the breaks 445 may be fabricated in the backside metal layer 420 by a patterning process. In embodiments, patterning the backside gold layer to have the breaks 445 may be done by using an Au-plating mask or an Au-etch mask. Herein, the diffusion barrier breaks 445 are positioned on the back of the wafer where the surface is flat, which is easier to cover and pattern than in the via 450.

The diffusion barrier 440 may then be deposited on the backside metal layer 420 in the via 450 and at the top of the via and in the breaks 445. The diffusion barrier 440 may substantially take on the shape of the vias 450. The diffusion barrier 440 may comprise a metal which has a lower rate of diffusion of the solder material than the backside metal layer 420. The diffusion barrier 440 may bridge the breaks 445 in the backside metal layer 420. In addition, the breaks 445 may define locations of the boundaries for the diffusion barrier 440. When the diffusion barrier 440 material has a lower rate of diffusion than soldering material (e.g., Au—Sn), damages caused by solder diffusion may be reduced or prevented. The material for the diffusion barrier 440 is selected such that the diffusion rate is reduced enough to prevent damage when the IC package is operated at its normal operating temperature for the predicted life of the product. In addition, the diffusion barrier 440 may prevent wetting of solder 460 such that the solder material does not fill the via 450 completely.

In embodiments, the diffusion barrier 440 may comprise Nickel (Ni). In other embodiments, the diffusion barrier may comprise Titanium Nitride (TiN), Tungsten Nitride (WN), Tantalum Nitride (TaN) or Chromium (Cr). In embodiments, the size of the break may be varied to the minimum to provide a sufficient barrier to diffusion while also minimizing the impact of added resistance between the backside metal layer 420 on the back of the wafer and the backside metal layer 420 in the via 450. Any other suitable material that has a lower rate of diffusion and prevents wetting of solder material may also be used to form the diffusion barrier 440. Herein, since the diffusion barrier 440 is deposited on the backside metal layer, the series resistance of the combined metal layers can be minimized since the resistance is averaged over a larger area than a diffusion barrier deposited between the metal layers.

In embodiments, the diffusion barrier 440 may be oxidized before the soldering material 460 is applied. Since oxidation of the barrier material contacting solder material prevents wetting of the soldering material, the diffusion barrier 440 may also function as a solder wetting barrier. In embodiments, the solder 460 on the diffusion barrier 440 does not have an excessive wetting condition and filling the via 450 with the soldering material 460 may be substantially prevented. In embodiments, some portion of the via 450 may be filled with the solder material 460. Accordingly, the solder material 460 should not contact the backside metal layer 420 at the bottom of the via 450. Thus, damages from the solder material 460, such as voids in the metal layers (e.g., 250 in FIG. 2) and distortions (e.g., 260 in FIG. 2), may be further prevented. A ground plane 470 may be provided on top of the solder material 460. The ground plane 470 may be connected to a ground terminal (not shown) and serve as a return path for current from different components on the IC chip.

Figure 5:
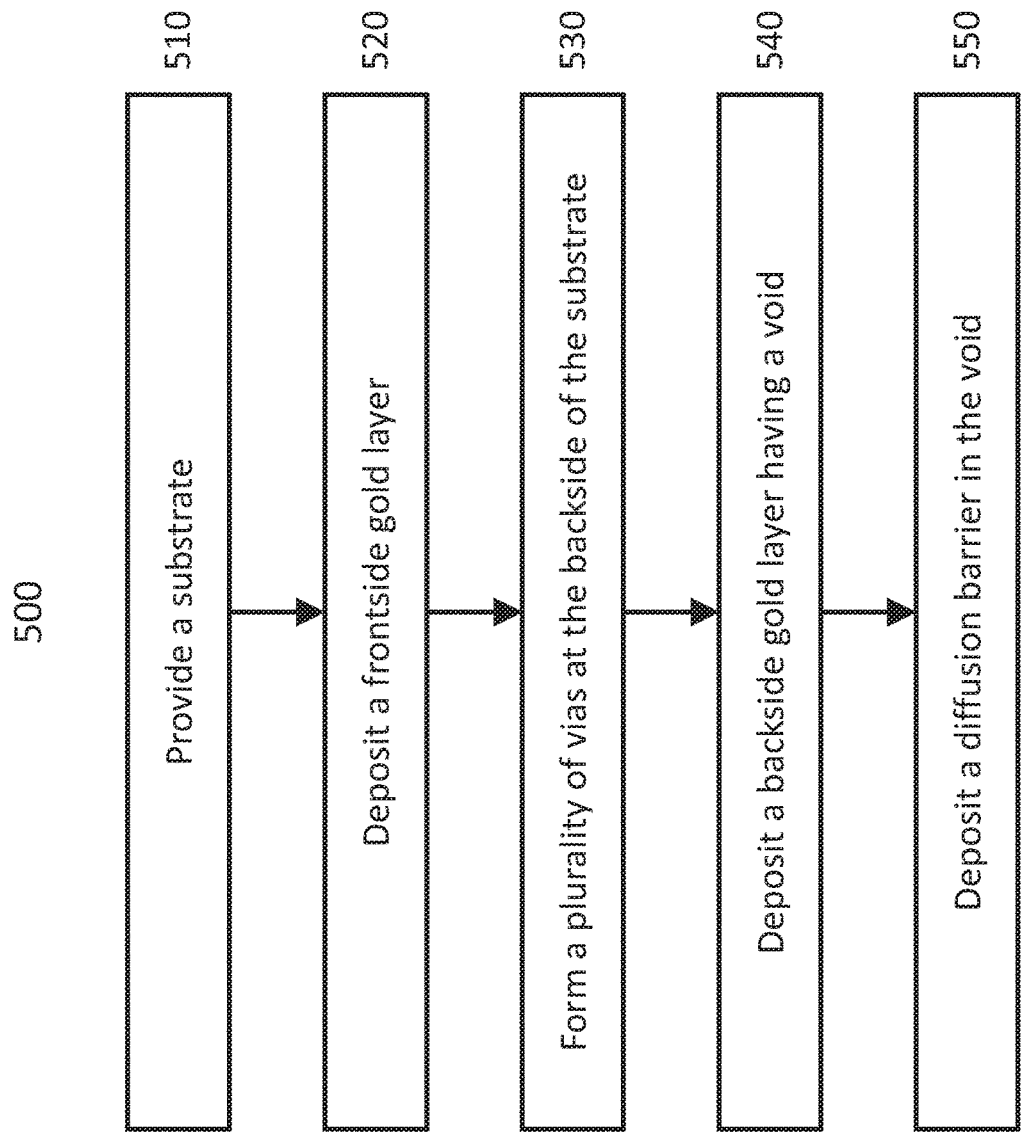
FIG. 5 is an illustrative flow diagram for fabricating a wafer having a diffusion barrier according to the concepts described herein.

Referring now to FIG. 5, an illustrative flow diagram for fabricating an IC having a diffusion barrier is presented. In the figure, rectangular elements (typified by element 510 in FIG. 5), herein denoted "processing blocks," represent instructions or groups of instructions. The processing blocks may represent steps performed in a process. The particular sequence of blocks described is illustrative only and can be varied without departing from the spirit of the concepts, structures, and techniques sought to be protected herein. Thus, unless otherwise stated, the blocks described below are unordered meaning that, when possible, the functions represented by the blocks can be performed in any convenient or desirable order.

In processing step 510, a substrate or wafer is provided. In embodiments, the substrate (e.g., 430 in FIG. 4) may comprise silicon carbide or a p-type substrate. In processing step 520, on the frontside of the substrate, a frontside metal layer (e.g., 410 in FIG. 3) is deposited. In embodiments, the frontside metal layer 410 may comprise a gold layer. In processing step 530, a plurality of vias are formed in the substrate from the backside of the substrate. In embodiments, the vias may be formed by an etching process. In processing step 540, a backside metal layer (e.g., 430 in FIG. 3) is deposited in the vias. In embodiments, the backside metal layer may comprise a gold layer. The backside metal layer may conform to the shape of the via formed in the substrate. The backside metal layer also includes breaks (e.g., 445 in FIG. 4) formed in the patterned backside metal layer.

In processing step 550, a diffusion layer (e.g., 440 in FIG. 4) may be deposited on the backside metal layer. In embodiments, the diffusion barrier may comprise nickel (Ni) or any other suitable material. The diffusion barrier may substantially maintain the shape of via.

According to the concepts described herein, combining a diffusion barrier break in the backside gold layer and covering the plated gold in the via with nickel (Ni) will reduce diffusion of Tin(Sn) of the solder material (Au—Sn) to the metal layers and also diffusion of Au towards the solder layer. In addition, the same plated Ni structure can be oxidized to further prevent the wetting of the Au—Sn solder in the vias.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Accordingly, other embodiments are within the scope of the following claims.

What is claimed is:

1. A method for fabricating an integrated circuit, the method comprising:
   providing a substrate having a frontside and a backside;
   depositing a frontside metal layer on the frontside of the substrate; forming a via in the substrate;
   depositing a backside metal layer onto the backside of the substrate and into the via such that a portion of the backside metal layer is connected to a portion of the frontside metal layer;
   depositing a diffusion barrier onto the backside metal layer located in the via, the diffusion barrier substantially maintaining a shape of the vial forming first and second areas of active and/or passive components located on the frontside of the substrate and separated by the via, wherein the frontside metal layer includes interconnects to connect the components of the first and second areas of active and/or passive components;
   forming a solder layer over the diffusion barrier and the via; and
   forming a ground plane over the solder layer, wherein a path to the ground plane includes the solder layer, the diffusion barrier, the backside metal layer and the frontside metal layer.

2. The method of claim 1, wherein the diffusion barrier comprises a nickel (Ni) layer.

3. The method of claim 1, wherein the diffusion barrier comprises at least one of tantalum nitride, tungsten nitride, titanium nitride, and chromium.

4. The method of claim 1, wherein the diffusion barrier is oxidized to form a solder wetting barrier.

5. The method of claim 1, further comprising depositing a solder layer upon the diffusion barrier filling only a portion of the via.

6. The method of claim 1, further comprising:
   depositing a thin layer of adhesive material between the frontside metal layer and the backside metal layer.

7. The method of claim 1, wherein the depositing the diffusion barrier comprises patterning the diffusion barrier over the backside metal layer.

8. The method of claim 1, wherein the backside metal layer comprises breaks proximate an end of the via corresponding to the backside of the substrate, and further including depositing the diffusion barrier into the breaks.

9. The method of claim 1, wherein the frontside metal layer comprises gold.

10. The method of claim 1, wherein the backside metal layer comprises gold.

11. An integrated circuit comprising:
a substrate having a frontside and a backside;
a frontside metal layer deposited on the frontside of the substrate;
a backside metal layer deposited onto the backside of the substrate and into a via formed in the substrate, wherein a portion of the backside metal layer is connected to a portion of the frontside metal layer;
a diffusion barrier deposited onto the backside metal layer located in the via, wherein the diffusion barrier substantially maintains a shape of the via;
first and second areas of active and/or passive components located on the frontside of the substrate and separated by the via, wherein the frontside metal layer includes interconnects to connect the components of the first and second areas of active and/or passive components;
a solder layer over the diffusion barrier and the via; and
a ground plane over the solder layer, wherein a path to the ground plane includes the solder layer, the diffusion barrier, the backside metal layer and the frontside metal layer.

12. The integrated circuit of claim 11, wherein the diffusion barrier comprises a nickel (Ni) layer.

13. The integrated circuit of claim 11, wherein the diffusion barrier comprises at least one of tantalum nitride, tungsten nitride, titanium nitride, and chromium.

14. The integrated circuit of claim 11, wherein the diffusion barrier is oxidized to form a solder wetting barrier.

15. The integrated circuit of claim 11, wherein the solder layer deposited upon the diffusion barrier fills a portion of the via.

16. The integrated circuit of claim 11, further comprising:
a thin layer of adhesive material deposited between the frontside metal layer and the backside metal layer.

17. The integrated circuit of claim 11, wherein the frontside metal layer comprises gold.

18. The integrated circuit of claim 11, wherein the backside metal layer comprises gold.

19. The integrated circuit of claim 11, wherein the backside metal layer includes a stop at the backside of the substrate.

* * * * *